United States Patent
Yu et al.

(10) Patent No.: US 9,716,172 B2
(45) Date of Patent: Jul. 25, 2017

(54) SEMICONDUCTOR DEVICE HAVING MULTIPLE ACTIVE AREA LAYERS AND ITS FORMATION THEREOF

(71) Applicant: Taiwan Semiconductor Manufacturing Company Limited, Hsin-Chu (TW)

(72) Inventors: Tsung-Hsing Yu, Taipei (TW); Chia-Wen Liu, Taipei (TW); Yeh Hsu, Guishan Township (TW); Ken-Ichi Goto, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/257,033

(22) Filed: Apr. 21, 2014

(65) Prior Publication Data

US 2015/0303302 A1    Oct. 22, 2015

(51) Int. Cl.
*H01L 29/78*    (2006.01)
*H01L 29/66*    (2006.01)
(Continued)

(52) U.S. Cl.
CPC ...... *H01L 29/7834* (2013.01); *H01L 29/1054* (2013.01); *H01L 29/66628* (2013.01);
(Continued)

(58) Field of Classification Search
CPC ....... H01L 29/66636; H01L 21/823418; H01L 21/823814; H01L 29/41783
See application file for complete search history.

(56) References Cited

U.S. PATENT DOCUMENTS

2005/0179028 A1* 8/2005 Chen ................ H01L 21/02381
                                                        257/19
2007/0187767 A1   8/2007 Yasutake
(Continued)

FOREIGN PATENT DOCUMENTS

CN    102171794     8/2011
TW    200849409    12/2008

OTHER PUBLICATIONS

Corresponding Korean application, Korean Office action dated Dec. 7, 2015, 10 pages.
(Continued)

*Primary Examiner* — Michael Jung
*Assistant Examiner* — Mikka Liu
(74) *Attorney, Agent, or Firm* — Cooper Legal Group, LLC

(57) ABSTRACT

A semiconductor device and method of forming the same are described. A semiconductor device includes an active area adjacent a channel in a semiconductor composite. The active area includes a first active area layer having a first dopant concentration, a second active area layer having a second dopant concentration over the first active area layer, and a third active area layer having a third dopant concentration, over the second active area. The third dopant concentration is greater than the second dopant concentration, and the second dopant concentration is greater than the first dopant concentration. The channel includes a second channel layer comprising carbon over a first channel layer and a third channel layer over the second channel layer. The active area configuration improves drive current and reduces contact resistance, and the channel configuration increases short channel control, as compared to a semiconductor device without the active area and channel configuration.

20 Claims, 7 Drawing Sheets

(51) Int. Cl.
    *H01L 21/265*     (2006.01)
    *H01L 29/10*     (2006.01)
    *H01L 29/165*     (2006.01)

(52) U.S. Cl.
    CPC .. H01L 29/66636 (2013.01); H01L 29/66651 (2013.01); H01L 29/7848 (2013.01); *H01L 21/26506* (2013.01); *H01L 29/1045* (2013.01); *H01L 29/165* (2013.01); *H01L 29/66492* (2013.01)

(56) References Cited

U.S. PATENT DOCUMENTS

| | | | | |
|---|---|---|---|---|
| 2008/0224218 | A1* | 9/2008 | Liu | H01L 21/823807 257/351 |
| 2009/0291540 | A1 | 11/2009 | Zhang et al. | |
| 2010/0258868 | A1* | 10/2010 | Yin | H01L 29/0653 257/347 |
| 2013/0069123 | A1* | 3/2013 | Illgen | H01L 21/823807 257/288 |
| 2013/0178024 | A1* | 7/2013 | Flachowsky | H01L 21/823807 438/199 |
| 2014/0087537 | A1* | 3/2014 | Kim | H01L 29/66477 438/301 |

OTHER PUBLICATIONS

Corresponding Taiwan application, Taiwan Office action dated Mar. 11, 2016 16 pages.

\* cited by examiner

SEMICONDUCTOR DEVICE HAVING MULTIPLE ACTIVE AREA LAYERS AND ITS FORMATION THEREOF

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

DESCRIPTION OF THE DRAWINGS

Aspects of the disclosure are understood from the following detailed description when read with the accompanying drawings. It will be appreciated that elements and/or structures of the drawings are not necessarily drawn to scale. Accordingly, the dimensions of the various features may be arbitrarily increased and/or reduced for clarity of discussion.

DETAILED DESCRIPTION

Figure 1:
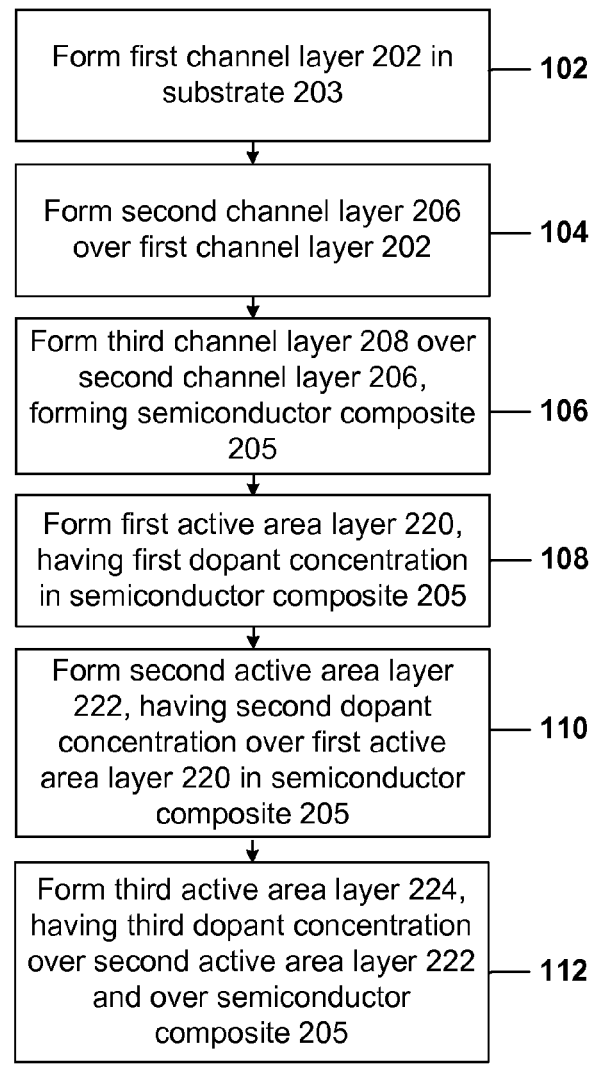
FIG. 1 is a flow diagram illustrating a method of forming a semiconductor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

A method 100 of forming a semiconductor device 200 and a semiconductor device 300 according to some embodiments is illustrated in FIG. 1 and one or more structures formed thereby at various stages of fabrication are illustrated in FIGS. 2-15. According to some embodiments, a semiconductor device 200 comprises a semiconductor composite 205 as illustrated in FIG. 11. In some embodiments, a semiconductor composite 205 comprises a first channel layer 202, a second channel layer 206, and a third channel layer 208. In some embodiments, the semiconductor device 200 comprises an active area 207 in the semiconductor composite 205 and adjacent a gate 210. In some embodiments, the active area 207 comprises a first active area layer 220 having a first dopant concentration, a second active area layer 222 having a second dopant concentration, the second active area layer 222 over the first active area layer 220, and a third active area layer 224 having a third dopant concentration, the third active area layer 224 over the second active area layer 222, and over a top surface 205a of the semiconductor composite 205. In some embodiments, the first dopant concentration, the second dopant concentration and the third dopant concentration of the semiconductor device 200 comprises a p-type dopant. In some embodiments, the semiconductor device 300 comprises the semiconductor composite 205, as illustrated in FIG. 15. In some embodiments, the semiconductor device 300 comprises an active area 307 in the semiconductor composite 205 and adjacent a gate 210. In some embodiments, the active area 307 comprises a first active area layer 320 having a first dopant concentration, and a second active area layer 322 having a second dopant concentration, the second active area layer 322 over the first active area layer 320. In some embodiments, the active area 307 comprises a third active area layer 324 having a third dopant concentration, the third active area layer 324 over the second active area layer 322, and over the top surface 205a of the semiconductor composite 205. In some embodiments, the first dopant concentration, the second dopant concentration and the third dopant concentration of the semiconductor device 300 comprises an n-type dopant.

Figure 2:
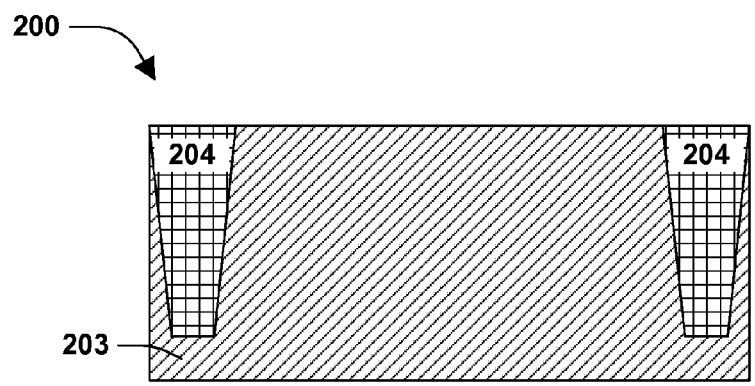
FIG. 2 is an illustration of a semiconductor device, according to some embodiments.
Figure 3:
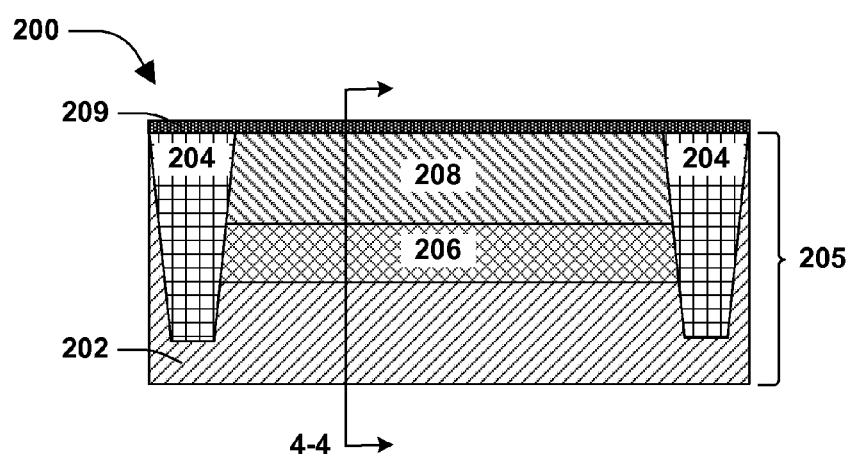
FIG. 3 is an illustration of a semiconductor device, according to some embodiments.
Figure 4:
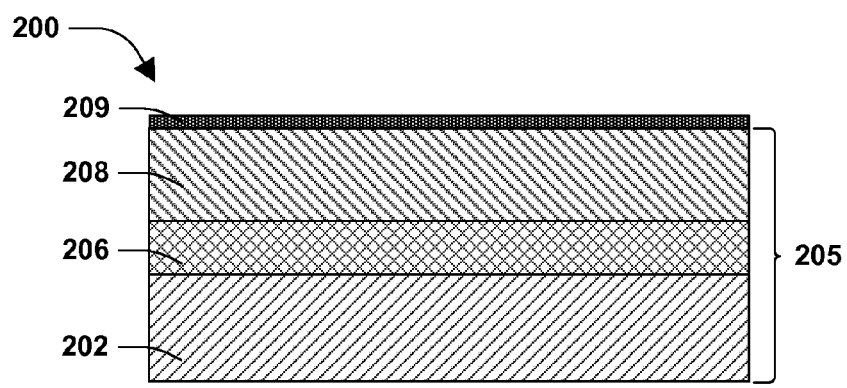
FIG. 4 is an illustration of a semiconductor device, according to some embodiments.

At 102, a first channel layer 202 is formed in a substrate 203, to form the semiconductor device 200, as illustrated in FIGS. 2-3, or the semiconductor device 300, according to some embodiments. Turning to FIG. 2, a substrate 203 is between shallow trench isolation (STI) areas 204. In some embodiments, the substrate 203 comprises at least one of silicon or germanium. According to some embodiments, the substrate 203 comprises at least one of an epitaxial layer, a silicon-on-insulator (SOI) structure, a wafer, or a die formed from a wafer. In some embodiments, the STI area 204 comprises a dielectric material, such as silicon oxide ($SiO_2$). In some embodiments, a first channel layer implant is implanted into the substrate 203. In some embodiments, the first channel layer implant comprises germanium. In some embodiments, a first anneal is performed on the substrate 203. In some embodiments, the first anneal comprises applying a high temperature between about 400° C. to about 1000° C. to the semiconductor device. In some embodiments, the anneal repairs damage to the lattice structure in the substrate 203 caused by the first channel layer implant. In some embodiments, the substrate 203 is recessed, such as by etching, to form the first channel layer 202.

At 104, the second channel layer 206 is formed over the first channel layer 202 to form the semiconductor device 200, as illustrated in FIG. 3 or the semiconductor device 300, according to some embodiments. In some embodiments, the second channel layer 206 is grown, such as by epitaxial growth. In some embodiments, the second channel layer 206 comprises at least one of silicon or carbon. In some embodiments, the second channel layer 206 comprises less than about 1% carbon. In some embodiments, the second channel layer 206 has a second channel layer height between about 2 nm to about 15 nm. In some embodiments, the carbon is added to the second channel layer 206 composition by in situ doping.

Figure 5:
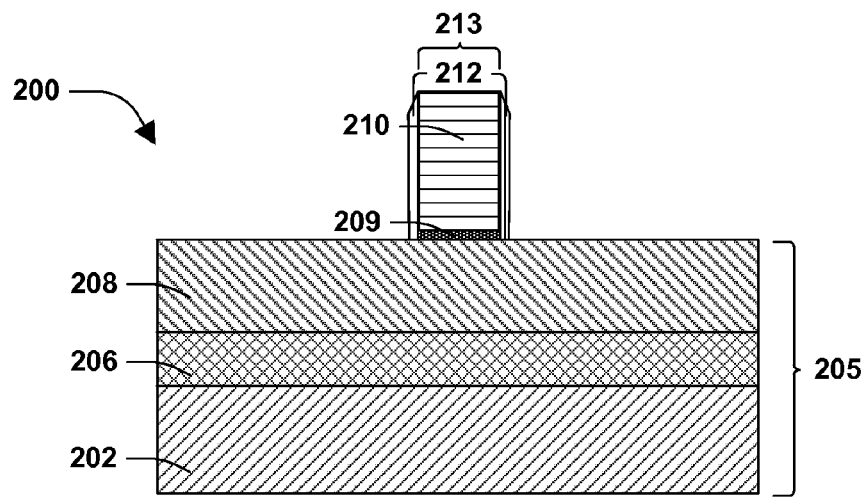
FIG. 5 is an illustration of a semiconductor device, according to some embodiments.
Figure 6:
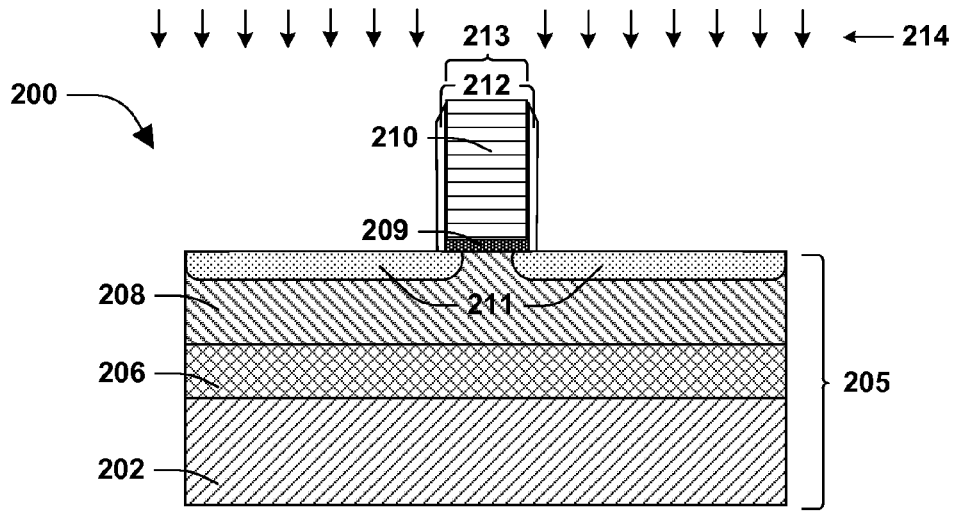
FIG. 6 is an illustration of a semiconductor device, according to some embodiments.
Figure 7:
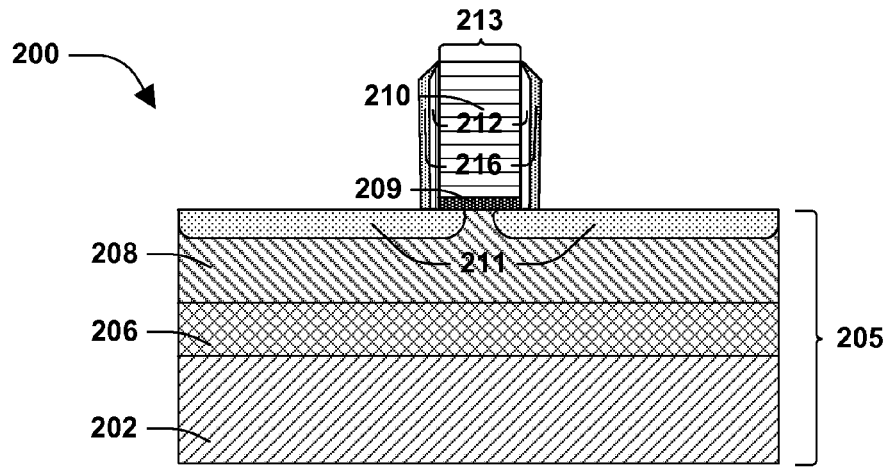
FIG. 7 is an illustration of a semiconductor device, according to some embodiments.
Figure 8:
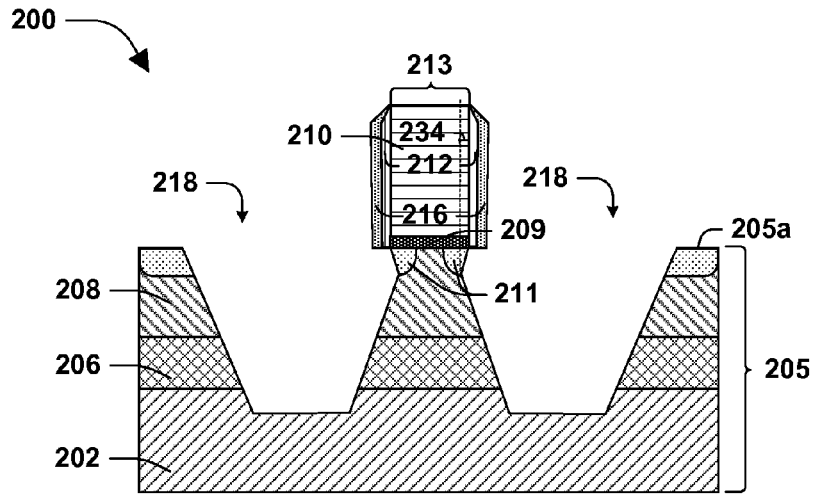
FIG. 8 is an illustration of a semiconductor device, according to some embodiments.

At 106, the third channel layer 208 is formed over the second channel layer 206 to form the semiconductor device 200, as illustrated in FIG. 3 or the semiconductor device 300, according to some embodiments. In some embodiments, the third channel layer 208 is grown, such as by epitaxial growth. In some embodiments, the third channel layer 208 comprises silicon. In some embodiments, the third channel layer 208 has a third channel layer height between about 5 nm to about 30 nm. In some embodiments, the first channel layer 202, the second channel layer 206, and the third channel layer 208 form a semiconductor composite 205. In some embodiments, an oxide layer 209 is formed over the third channel layer 208 and the STI area 204, as illustrated in FIG. 3. Turning to FIGS. 4-15, a cross-sectional view of the semiconductor device is illustrated as viewed from a perspective indicated by arrows on line 4-4 in FIG. 3. In some embodiments, a gate 210 is formed over the oxide layer 209, as illustrated in FIG. 5. In some embodiments, a gate material is formed over the oxide layer 209, and the gate material and the oxide layer 209 are patterned for form a gate structure 213. In some embodiments, the gate 210 comprises at least one of a metal or a polysilicon. In some embodiments, the gate structure 213 comprises a hard mask (not shown) over the gate 210. In some embodiments, first sidewall spacers 212 are formed on sidewalls of the gate 210. In some embodiments, the first sidewall spacers 212 comprise oxide. In some embodiments, a halo implant 214 is performed on the semiconductor composite 205 to form a halo region 211, as illustrated in FIG. 6. In some embodiments, the halo implant 214 comprises implanting at least one a p-type dopant or an n-type dopant. In some embodiments, a second anneal is performed on the semiconductor composite 205. In some embodiments, the second anneal comprises applying a high temperature between about 400° C. to about 1000° C. to the semiconductor composite 205. In some embodiments, the second anneal repairs damage to a lattice structure in the semiconductor composite 205 caused by the halo implant 214 and expands the halo region 211, such that the halo region 211 is farther under the gate structure 213 than the halo region 211 was before the second anneal, as illustrated in FIG. 7. In some embodiments, a second sidewall spacer 216 is formed adjacent the first sidewall spacer 212, as illustrated in FIG. 8. In some embodiments, the second sidewall spacer comprises a nitride. In some embodiments, an LDD implant (not shown) follows the halo implant 214. In some embodiments, the LDD implant is performed at an angle less than 20° relative to a line perpendicular to the top surface 205a of the first semiconductor composite 205.

Figure 9:
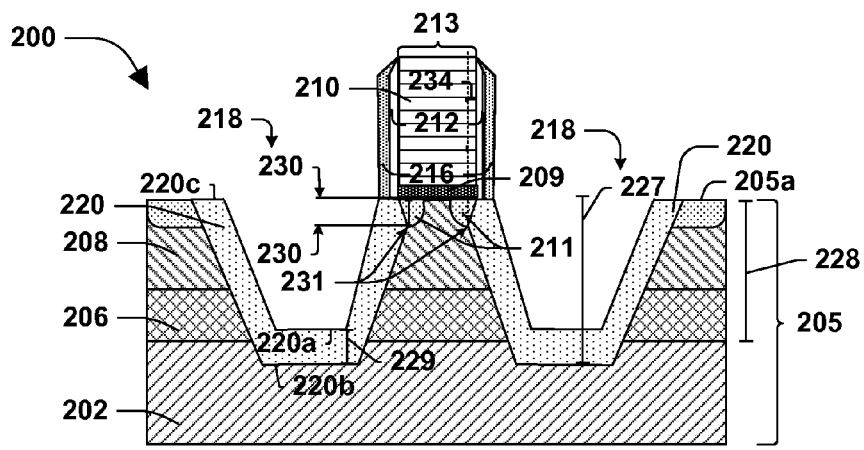
FIG. 9 is an illustration of a semiconductor device, according to some embodiments.

At 108, a first active area layer 220 having a first dopant concentration is formed in the semiconductor composite 205, to form the semiconductor device 200, as illustrated in FIG. 9. Prior to FIG. 9, a first opening 218 is formed in the semiconductor composite 205, such that the first opening 218 is partially under the gate structure 213 and extends into the first channel layer 202, as illustrated in FIG. 8. In some embodiments, the first opening 218 is formed by etching. In some embodiments, the first opening 218 comprises at least one of a triangular or convex quadrilateral shape. In some embodiments, the first active area layer 220 is formed in the first opening 218, as illustrated in FIG. 9. In some embodiments, the first active area layer 220 comprises at least one of silicon or germanium. In some embodiment, a first germanium gradient is created during the first active area layer 220 growth, such that a percentage of germanium increases from a bottom surface 220b of the first active area layer 220 to a bottom most top surface 220a of the first active area layer 220. In some embodiments, the bottom surface 220b of the first active area layer 220 has a concentration of between about 10% germanium to about 30% germanium and the bottom most top surface 220a of the first active area layer 220 has a concentration of between about 15% germanium to about 40% germanium. In some embodiments, the first active area layer 220 has a constant germanium mole fraction of between about 15% germanium to about 40% germanium. In some embodiments, the first dopant comprises a first p-type dopant, such as boron or undoped intrinsic boron. In some embodiments, the first dopant concentration is below $1\ e^{19} cm^{-3}$ of the first p-type dopant. In some embodiments, the first active area layer 220 is undoped. In some embodiments, the first active area layer 220 is grown, such as by epitaxial growth, in the presence of the first p-type dopant, in the first opening 218. In some embodiments, the first active area layer 220 is grown conformally to the first opening 218, such that the first active area layer 220 comprises at least one of a triangular or convex quadrilateral shape. In some embodiments, the first active area layer 220 has a uniform thickness. In some embodiments, the first active area layer 220 does not have a uniform thickness. In some embodiments, the first active area layer 220 has a first active area layer thickness 229 of between about 5 nm to about 30 nm, where the thickness is measured from the bottom surface 220b of the first active area layer 220 to the bottom most top surface 220a of the first active area layer 220. In some embodiments, the first active area layer 220 comprises a tip portion 231 extending farthest under the gate structure 213. In some embodiments, the tip portion 231 is separated a first distance 230 from a bottom surface of the gate structure 213, the first distance 230 less than about 10 nm. In some embodiments, the tip portion 231 is a second distance 234 under the gate structure 213, where the second distance is between about 2 nm to about 10 nm. In some embodiments, the first active area layer 220 has a first active area depth 227, as measured from the bottom surface 220b of the first active area layer 220 to the top surface 205a of the semiconductor composite 205, as illustrated in FIG. 9. In some embodiments, the first active area depth 227 is greater than a sum of the second channel layer height and the third channel layer height 228.

Figure 10:
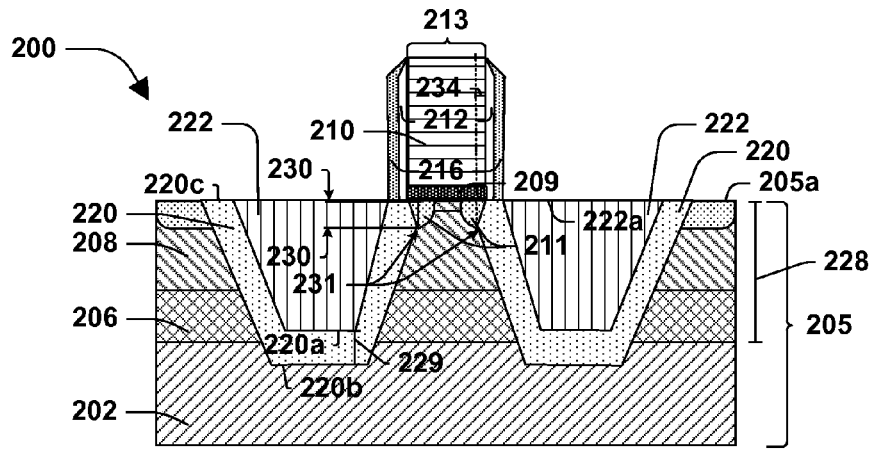
FIG. 10 is an illustration of a semiconductor device, according to some embodiments.
Figure 11:
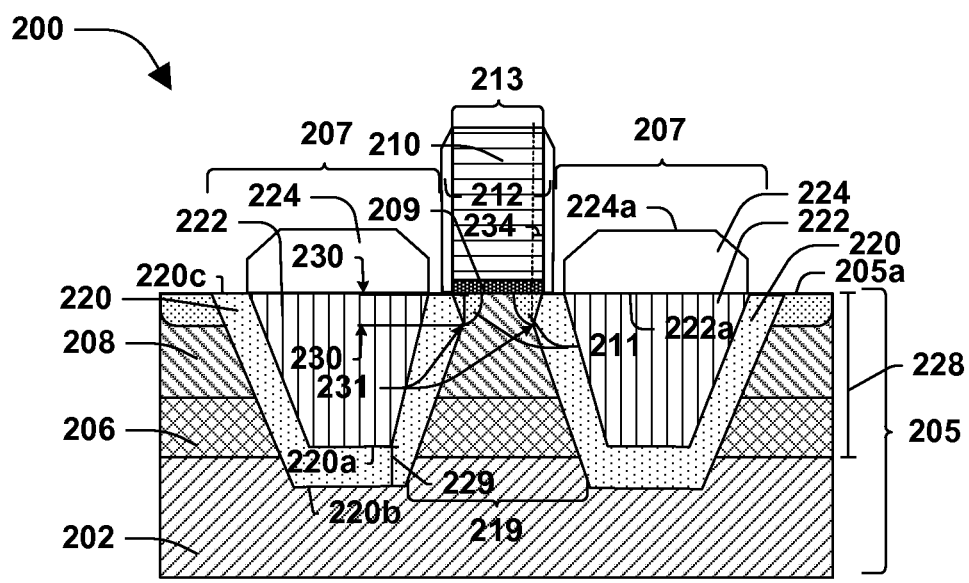
FIG. 11 is an illustration of a semiconductor device, according to some embodiments.

At 110, a second active area layer 222 having a second dopant concentration is formed over the first active area layer 220 in the semiconductor composite 205 to form the semiconductor device 200, as illustrated in FIG. 10, according to some embodiments. In some embodiments, the second active area layer 222 comprises at least one of silicon or germanium. In some embodiments, the second dopant comprises a second p-type dopant, such as boron or heavy intrinsic boron. In some embodiments, the second dopant concentration is greater than the first dopant concentration. In some embodiment, a second germanium gradient is created during the second active area layer 222 formation, such that a percentage of germanium increases from a bottom surface of the second active area layer 222 to the top surface 222a of the second active area layer 222. In some embodiments, the bottom surface of the second active area layer 222 has a concentration of between about 20% germanium to about 50% germanium and the top surface 222a of the second active area layer 222 has a concentration of between about 30% germanium to about 60% germanium. In some embodiments, the second active area layer 222 has a constant germanium mole fraction of between about 30% germanium to about 60% germanium. In some embodiments, the second dopant concentration is between about 5 $e^{19}cm^{-3}$ to about 5 $e^{20}cm^{-3}$ of the second p-type dopant. In some embodiments, the second active area layer 222 is grown, such as by epitaxial growth, in the presence of the second p-type dopant, in the first opening 218 over the first active area layer 220. In some embodiments, the second active area layer 222 is grown such that the second active area layer 222 fills the first opening 218. In some embodiments, the second active area layer 222 has a second active area layer thickness between about 10 nm to about 40 nm, where the second active area layer thickness is measured from the bottom most top surface 220a of the first active area layer 220 to the top surface 222a of the second active area layer 222.

At 112, a third active area layer 224 having a third dopant concentration is formed over the second active area layer 222 and above the semiconductor composite 205 to form the semiconductor device 200, as illustrated in FIG. 11, according to some embodiments. In some embodiments, the first active area layer 220, the second active area layer 222, and the third active area layer 224 comprise an active area 207. In some embodiments, the third active area layer 224 comprises at least one of silicon or germanium. In some embodiments, the third active area layer 224 has a concentration of less than 50% germanium. In some embodiments, the third dopant comprises a third p-type dopant, such as boron or heavy intrinsic boron. In some embodiments, the third dopant concentration is greater than the second dopant concentration. In some embodiments, the third dopant concentration comprises between about 3 $e^{20}cm^{-3}$ to about 5 $e^{21}cm^{-3}$ of the third p-type dopant In some embodiments, the third active area layer 224 is grown, such as by epitaxial growth, in the presence of the third p-type dopant, over the second active area layer 222 and above the top surface 205a of the semiconductor composite 205, such that the third active area layer 224 is adjacent the gate structure 213. In some embodiments, the third active area layer 224 is grown such that the third active area layer 224 is on the top surface 222a of the second active area layer 222 and the first active area layer 220. In some embodiments, the third active area layer 224 is patterned, such that the third active area layer 224 is on the top surface 222a of the second active area layer 222 and not the top most top surface 220c of the first active area layer 220. In some embodiments, the third active area layer 224 has a third active area layer thickness between about 5 nm to about 20 nm, where the third active area layer thickness is measured from the top surface 222a of the second active area layer 222 to a top surface 224a of the third active area layer 224. In some embodiments, the second spacer 216 is removed. In some embodiments, the active area 207 comprises at least one of a source or a drain. In some embodiments, a channel 219 is formed under the gate structure 213 and adjacent the active area 207. In some embodiments, the boron and the first germanium gradient in the first active area layer 220 maintain short channel control as compared to an active area that does not have at least one of a first germanium gradient or the first dopant concentration. In some embodiments, the increased second dopant concentration in the second active area layer 222 reduces a source/drain extension resistance and a source/drain spreading resistance, as compared to an active area that does not comprise the second active area layer 222. In some embodiments, the third active area layer reduces a silicon contact resistance as compared to an active area that does not have a third active area layer 224. In some embodiments, the semiconductor device 200 has less local variation as compared to a device that does not comprise the structure of the semiconductor device 200. In some embodiments, local variation comprises variation in dopant saturation in a first semiconductor device on a chip compared to a dopant saturation on a second semiconductor device on the chip. In some embodiments, local variation comprises line edge roughness (LER) variation in a first semiconductor device on a chip compared to the LER of a second semiconductor device on the chip. In some embodiments, the semiconductor device 200 has less global variation as compared to a device that does not comprise the structure of the semiconductor device 200. In some embodiments, global variation comprises dimension variation in a channel width of a first semiconductor device on a chip compared to a channel width of a second semiconductor device on the chip.

Figure 12:
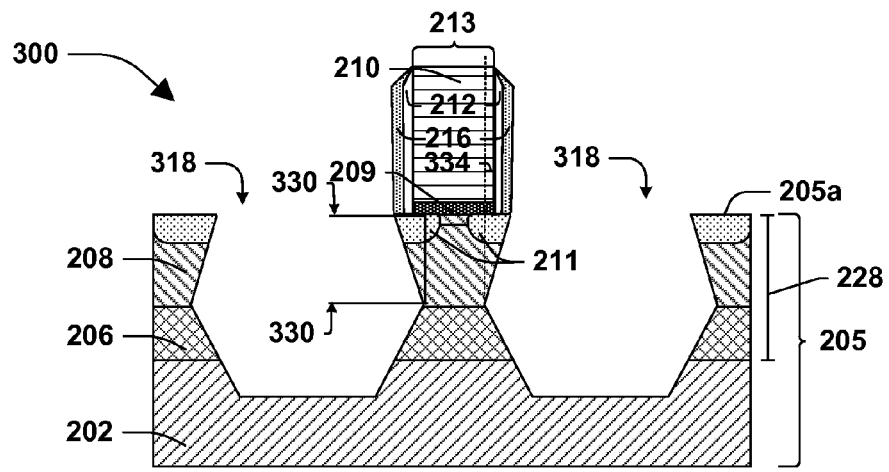
FIG. 12 is an illustration of a semiconductor device, according to some embodiments.
Figure 13:
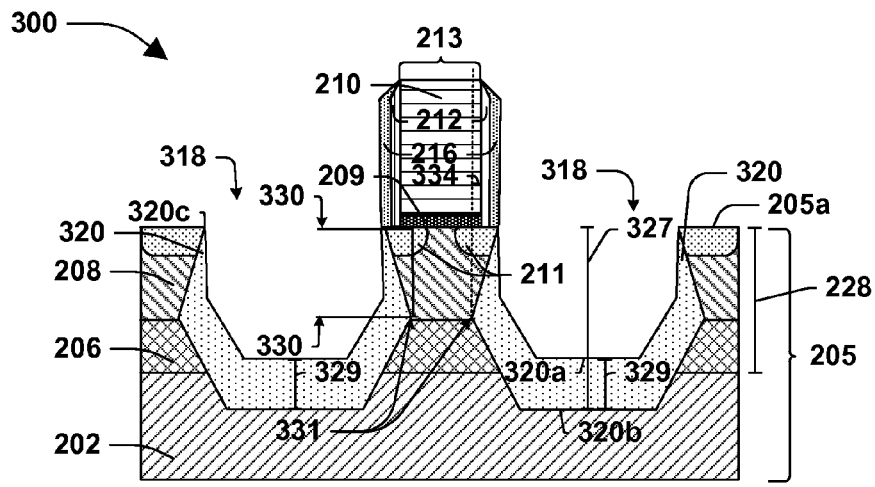
FIG. 13 is an illustration of a semiconductor device, according to some embodiments.

At 108, a first active area layer 320 having a first dopant concentration is formed in the semiconductor composite 205, to form the semiconductor device 300, as illustrated in FIG. 13. Prior to FIG. 13, a first opening 318 is formed in the semiconductor composite 205, such that the first opening 318 is partially under the gate structure 213 and extends into the first channel layer 202, as illustrated in FIG. 12. In some embodiments, the first opening 318 is formed by etching. In some embodiments, the first opening 318 comprises at least one of a pentagonal shape or other shape comprising a polygon. In some embodiments, the first active area layer 320 is formed in the first opening, as illustrated in FIG. 13. In some embodiments, the first active area layer 320 comprises silicon. In some embodiments, the first dopant comprises a first n-type dopant, such as phosphorous or intrinsic doped phosphorus. In some embodiments, the first active area layer 320 comprises less than about 5% of carbon. In some embodiments, the first dopant concentration comprises between about 1 $e^{20}cm^{-3}$ to about 3 $e^{20}cm^{-3}$ of the first n-type dopant. In some embodiments, the first active area layer 320 is grown, such as by epitaxial growth, in the presence of the first n-type dopant, in the first opening 318. In some embodiments, the first active area layer 320 is grown conformally to the first opening 218, such that the first active area layer 220 comprises at least one of a pentagonal shape or other shape comprising a polygon. In some embodiments, the first active area layer 320 has a uniform thickness. In some embodiments, the first active area layer 320 does not have a uniform thickness. In some embodiments, the first active area layer 320 has a first active area layer thickness 329 of between about 10 nm to about 25 nm, such that the thickness is measured from a bottom surface 320b of the first active area layer 320 to a bottom most top surface 320a of the first active area layer 320. In some embodiments, the first active area layer 320 comprises a tip portion 331 extending farthest under the gate structure 213. In some embodiments, the tip portion 331 is separated a first distance 330 from the bottom surface of the gate structure 213, the first distance 330 less than about 10 nm. In some embodiments, the tip portion 331 is a second distance 334 under the gate structure 213, where the second distance is between about 2 nm to about 10 nm. In some embodiments, the first active area layer 320 has a first active area depth 327, as measured from the bottom surface 320b of the first active area layer 320 to the top surface 205a of the semiconductor composite 205, as illustrated in FIG. 13. In some embodiments, the first active area depth 327 is greater than a sum of the second channel layer height and the third channel layer height 228.

Figure 14:
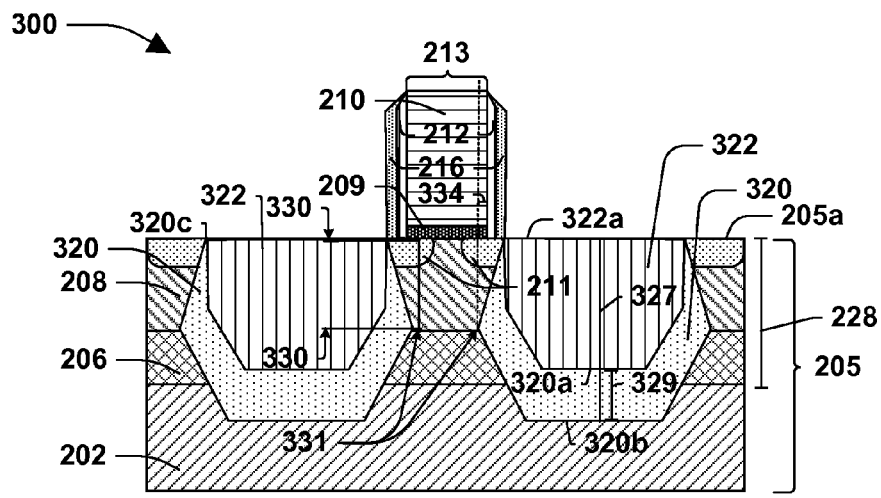
FIG. 14 is an illustration of a semiconductor device, according to some embodiments.
Figure 15:
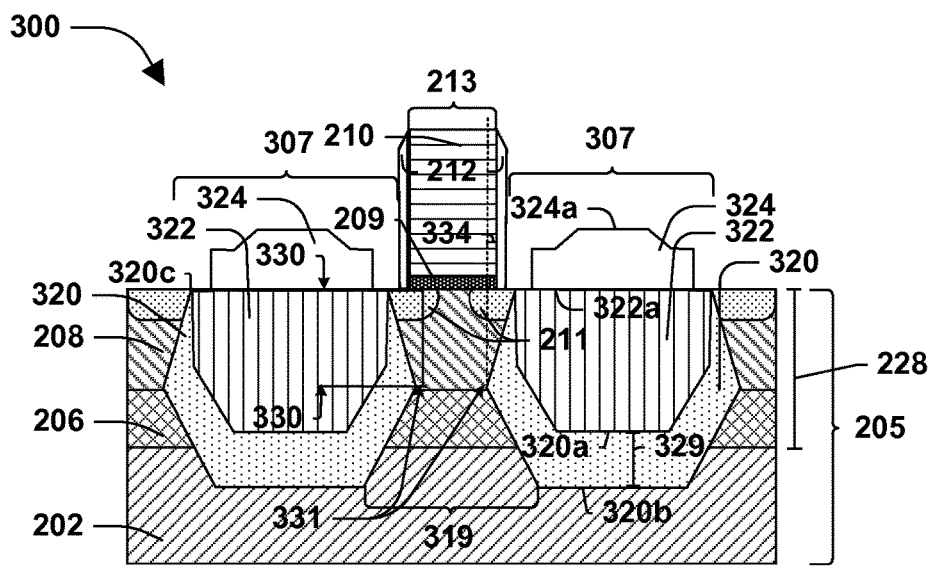
FIG. 15 is an illustration of a semiconductor device, according to some embodiments.

At 110, a second active area layer 322 having a second dopant concentration is formed over the first active area layer 320 in the semiconductor composite 205 to form the semiconductor device 300, as illustrated in FIG. 14, according to some embodiments. In some embodiments, the second active area layer 322 comprises silicon. In some embodiments, the second dopant comprises a second n-type dopant, such as phosphorus or high intrinsic doped phosphorous. In some embodiments, the second dopant concentration is greater than the first dopant concentration. In some embodiments, the second dopant concentration comprises between about 15% to about 35% of the second n-type dopant. In some embodiments, the second dopant concentration comprises between about $2\ e^{20} cm^{-3}$ to about $7\ e^{20} cm^{-3}$ of the second n-type dopant. In some embodiments, the second active area layer 322 is grown, such as by epitaxial growth, in the presence of the second n-type dopant, in the first opening 318 over the first active area layer 320. In some embodiments, the second active area layer 322 is grown such that the second active area layer 322 fills the first opening 318. In some embodiments, the second active area layer 322 has a second active area layer thickness between about 3 nm to about 15 nm, where the second active area layer thickness is measured from the bottom most top surface 320a of the first active area layer 320 to a top surface 322a of the second active area layer 322.

At 112, a third active area layer 324 having a third dopant concentration is formed over the second active area layer 322 and above the semiconductor composite 205 to form the semiconductor device 300, as illustrated in FIG. 15, according to some embodiments. In some embodiments, the first active area layer 320, the second active area layer 322, and the third active area layer 324 comprise an active area 307. In some embodiments, the third active area layer 324 comprises silicon. In some embodiments, the third dopant comprises a third n-type dopant such as phosphorus or high intrinsic doped phosphorous. In some embodiments, the third dopant concentration comprises between about $3\ e^{20} cm^{-3}$ to about $5\ e^{21} cm^{-3}$ of the third n-type dopant. In some embodiments, the third dopant concentration is greater than the second dopant concentration. In some embodiments, the third active area layer 324 is grown, such as by epitaxial growth in the presence of the third n-type dopant, over the second active area layer 322 and above the top surface 205a of the semiconductor composite 205, such that the third active area layer 324 is adjacent the gate structure 213. In some embodiments, the third active area layer 324 is grown, such that the third active area layer 324 is on the top surface 322a of the second active area layer 322 and a top most top surface 320c of the first active area layer 320. In some embodiments, the third active area layer 324 is patterned, such that the third active area layer 324 is on the top surface 322a of the second active area layer 322 and not on a top most top surface 320c of the first active area layer 320. In some embodiments, the third active area layer 324 has a third active area layer thickness between about 5 nm to about 25 nm, where the third active area layer thickness is measured from the top surface 322a of the second active area layer 322 to a top surface 324a of the third active area layer 324. In some embodiments, the second spacer 216 is removed. In some embodiments, the active area 307 comprises at least one of a source or a drain. In some embodiments, a channel 319 is formed under the gate structure 213 and adjacent the active area 307. In some embodiments, the first dopant concentration comprising phosphorus in the first active area layer 320 maintains short channel control as compared to an active area that does not have the first dopant concentration. In some embodiments, the increased second dopant concentration, comprising phosphorus in the second active area layer 322, reduces a source/drain extension resistance and a source/drain spreading resistance, as compared to an active area that does not comprise the second active area layer 322. In some embodiments, the third active area layer 324 reduces a silicon contact resistance as compared to an active area that does not have a third active area layer 324. In some embodiments, the semiconductor device 300 has less local variation as compared to a device that does not comprise the structure of the semiconductor device 300. In some embodiments, the semiconductor device 300 has less global variation as compared to a device that does not comprise the structure of the semiconductor device 300.

According to some embodiments, a semiconductor device comprises an active area. In some embodiments, an active area comprises a first active area layer having a first dopant concentration, a second active area layer having a second dopant concentration, the second active area layer over the first active area layer, and a third active area layer having a third dopant concentration. In some embodiments, the third active area layer is over the second active area layer and extending above a top surface of a semiconductor composite within which the first active area layer and the second active area layer are formed. In some embodiments, the first dopant concentration is less than the second dopant concentration, and the second dopant concentration is less than the third dopant concentration.

According to some embodiments, a method of forming a semiconductor device comprises forming a channel and forming an active area adjacent the channel. In some embodiments, the forming a channel comprises forming a first channel layer in a substrate, forming a second channel layer over the first channel layer and forming a third channel layer over the second channel layer. In some embodiments, a semiconductor composite comprises the first channel layer, the second channel layer and the third channel layer. In some embodiments, forming an active area adjacent the channel comprises forming a first active area layer in the semiconductor composite, the first active area layer having a first dopant concentration, forming a second active area layer in the semiconductor composite, the second active area layer having a second dopant concentration and formed over the first active area layer and forming a third active area layer over a top surface of the semiconductor composite, the third active area layer having a third dopant concentration and formed over the second active area layer.

According to some embodiments, a semiconductor device comprises a channel within a substrate comprising a first channel layer, a second channel layer over the first channel layer and a third channel layer over the second channel layer. In some embodiments, a semiconductor composite comprises the first channel layer, the second channel layer and the third channel layer. In some embodiments, an active area is adjacent the channel. In some embodiments, an active area comprises a first active area layer having a first dopant concentration, a second active area layer having a second dopant concentration, the second active area layer over the first active area layer, and a third active area layer having a third dopant concentration. In some embodiments, the third active area layer is over the second active area layer and extending above a top surface of a semiconductor composite within which the first active area layer and the second active area layer are formed. In some embodiments, the first dopant concentration is less than the second dopant concentration, and the second dopant concentration is less than the third dopant concentration.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
   an active area comprising:
      a first active area layer comprising germanium and having a first dopant concentration, wherein a percentage of the germanium in the first active area layer increases from a bottom surface of the first active area layer to a top surface of the first active area layer;
      a second active area layer having a second dopant concentration, the second active area layer over the first active area layer; and
      a third active area layer having a third dopant concentration, the third active area layer over the second active area layer and extending above a top surface of a semiconductor composite within which the first active area layer and the second active area layer are formed, where the first dopant concentration is less than the second dopant concentration, and the second dopant concentration is less than the third dopant concentration.

2. The semiconductor device of claim 1, comprising:
   a channel within the semiconductor composite and adjacent the active area, the channel comprising:
      a first channel layer;
      a second channel layer over the first channel layer; and
      a third channel layer over the second channel layer.

3. The semiconductor device of claim 2, the first active area layer having a first active area layer depth, the second channel layer having a second channel layer height and the third channel layer having a third channel layer height, the first active area layer depth greater than a sum of the second channel layer height and the third channel layer height.

4. The semiconductor device of claim 3, the sum of the second channel layer height and the third channel layer height less than or equal to about 40nm.

5. The semiconductor device of claim 2, wherein:
   the first channel layer is a germanium doped silicon layer,
   the second channel layer is an epitaxially grown silicon carbide layer, and
   the third channel layer is an epitaxially grown silicon layer.

6. The semiconductor device of claim 2, comprising a gate structure over the channel and adjacent the third active area layer.

7. The semiconductor device of claim 6, the gate structure spaced apart from the third active area layer by a gap.

8. The semiconductor device of claim 1, at least one of:
   the first dopant concentration below $1\ e^{19} cm^{-3}$ of a first p-type dopant; or
   the first dopant concentration between about $1\ e^{20} cm^{-3}$ to about $3 e^{20} cm^{-3}$ of a first n-type dopant.

9. The semiconductor device of claim 1, at least one of:
   the second dopant concentration between about $5\ e^{19} cm^{-3}$ to about $5\ e^{20} cm^{-3}$ of a second p-type dopant; or
   the second dopant concentration between about $2\ e^{20} cm^{-3}$ to about $7\ e^{20} cm^{-3}$ of a second n-type dopant.

10. The semiconductor device of claim 1, at least one of:
the third dopant concentration between about $3\ e^{20} cm^{-3}$ to about $5\ e^{21} cm^{-3}$ of a third p-type dopant; or
the third dopant concentration between about $3\ e^{20} cm^{-3}$ to about $5\ e^{21} cm^{-3}$ of a third n-type dopant.

11. The semiconductor device of claim 1, the second active area layer comprising germanium, wherein a percentage of the germanium in the second active area layer increases from a bottom surface of the second active area layer to a top surface of the second active area layer.

12. The semiconductor device of claim 11, wherein:
the first active area layer has a germanium concentration of between about 10% to about 40%, and
the second active area layer has a germanium concentration of between about 20% to about 60%.

13. A method of forming a semiconductor device comprising:
forming a channel comprising:
implanting a first dopant into a substrate and annealing to form a first channel layer in the substrate;
growing silicon carbide over the first channel layer to form a second channel layer over the first channel layer; and
growing silicon over the second channel layer to form a third channel layer over the second channel layer, a semiconductor composite comprising the first channel layer, the second channel layer and the third channel layer; and
forming an active area adjacent the channel, comprising:
forming a first active area layer in the semiconductor composite, the first active area layer having a first dopant concentration;
forming a second active area layer in the semiconductor composite, the second active area layer having a second dopant concentration and formed over the first active area layer; and
forming a third active area layer over a top surface of the semiconductor composite, the third active area layer having a third dopant concentration and formed over the second active area layer.

14. The method of claim 13, comprising:
performing a halo implant into the semiconductor composite prior to forming the first active area layer.

15. The method of claim 13, the forming the first active area layer comprising:
forming a first opening in the semiconductor composite; and
growing at least one of silicon or germanium in the first opening in the presence of at least one of a first n-type dopant or a first p-type dopant, such that the first active area layer comprises at least one of:
the first dopant concentration below $1\ e^{19} cm^{-3}$ of the first p-type dopant; or
the first dopant concentration between about $1\ e^{20} cm^{-3}$ to about $3\ e^{20} cm^{-3}$ of the first n-type dopant.

16. The method of claim 13, the forming the second active area layer comprising:
growing at least one of silicon or germanium over the first active area layer in the presence of at least one of a second n-type dopant or a second p-type dopant such that the second active area layer comprises at least one of:
the second dopant concentration between about $5\ e^{19} cm^{-3}$ to about $5\ e^{20} cm^{-3}$ of the second p-type dopant; or
the second dopant concentration between about $2\ e^{20} cm^{-3}$ to about $7\ e^{20} cm^{-3}$ of the second n-type dopant.

17. The method of claim 13, the forming the third active area layer comprising:
growing at least one of silicon or germanium over the second active area layer in the presence of at least one of a third n-type dopant or a third p-type dopant such that the third active area layer comprises at least one of:
the third dopant concentration between about $3\ e^{20} cm^{-3}$ to about $5\ e^{21} cm^{-3}$ of the third p-type dopant; or
the third dopant concentration between about $3\ e^{20} cm^{-3}$ to about $5\ e^{21} cm^{-3}$ of the third n-type dopant.

18. A semiconductor device comprising:
an active area, comprising:
a first active area layer in a semiconductor composite, the first active area layer having a first dopant concentration and a top surface of the first active area layer co-planar with a top surface of the semiconductor composite, and wherein:
the first active area layer comprises germanium, and
a percentage of the germanium in the first active area layer increases from a bottom surface of the first active area layer to a top surface of the first active area layer;
a second active area layer in the semiconductor composite, the second active area layer having a second dopant concentration and formed over the first active area layer and a top surface of the second active area layer co-planar with the top surface of the semiconductor composite; and
a third active area layer over the top surface of the second active area layer, the third active area layer having a third dopant concentration and formed over the second active area layer, where the first dopant concentration is less than the second dopant concentration, and the second dopant concentration is less than the third dopant concentration.

19. The semiconductor device of claim 18, a channel within the semiconductor composite and adjacent the active area, the channel comprising:
a germanium doped silicon layer,
an epitaxially grown silicon carbide layer over the germanium doped silicon layer, and
an epitaxially grown silicon layer over the epitaxially grown silicon carbide layer.

20. The semiconductor device of claim 18, the second active area layer comprising germanium, wherein a percentage of the germanium in the second active area layer increases from a bottom surface of the second active area layer to a top surface of the second active area layer.

* * * * *